(12) United States Patent
Sakai

(10) Patent No.: US 7,111,207 B2
(45) Date of Patent: Sep. 19, 2006

(54) ERROR-CORRECTING COMMUNICATION METHOD AND COMMUNICATION APPARATUS WITH DE-INTERLEAVING AND RATE DE-MATCHING

(75) Inventor: Takeshi Sakai, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 398 days.

(21) Appl. No.: 10/220,624

(22) PCT Filed: Jan. 31, 2001

(86) PCT No.: PCT/JP01/00675

§ 371 (c)(1),
(2), (4) Date: Sep. 4, 2002

(87) PCT Pub. No.: WO02/062001

PCT Pub. Date: Aug. 8, 2002

(65) Prior Publication Data

US 2003/0051202 A1    Mar. 13, 2003

(51) Int. Cl.
*H03M 13/27* (2006.01)
*H03M 13/35* (2006.01)

(52) U.S. Cl. ...................... 714/701; 714/774

(58) Field of Classification Search .......... 714/701, 714/774, 776
See application file for complete search history.

(56) References Cited

U.S. PATENT DOCUMENTS

| | | | | |
|---|---|---|---|---|
| 5,063,533 A | * | 11/1991 | Erhart et al. ............... | 711/157 |
| 6,160,840 A | * | 12/2000 | Park ........................... | 375/141 |
| 6,392,572 B1 | * | 5/2002 | Shiu et al. .................. | 341/81 |
| 6,473,442 B1 | * | 10/2002 | Lundsjo et al. ............. | 370/537 |
| 6,603,752 B1 | * | 8/2003 | Saifuddin et al. ........... | 370/335 |
| 6,625,763 B1 | * | 9/2003 | Boner ......................... | 714/701 |
| 6,671,851 B1 | * | 12/2003 | Moulsley .................... | 714/790 |
| 6,707,806 B1 | * | 3/2004 | Kato ........................... | 370/336 |
| 6,744,744 B1 | * | 6/2004 | Tong et al. .................. | 370/320 |
| 6,798,736 B1 | * | 9/2004 | Black et al. ................. | 370/208 |
| 6,798,826 B1 | * | 9/2004 | Shiu et al. .................. | 375/147 |

FOREIGN PATENT DOCUMENTS

| | | |
|---|---|---|
| EP | 1045521 | 10/2000 |
| JP | 63-67052 | 3/1988 |
| JP | 9-162755 | 6/1997 |
| JP | 9-238087 | 9/1997 |
| JP | 2000-353964 | 12/2000 |
| JP | 2001-16640 | 1/2001 |

OTHER PUBLICATIONS

"3rd Generation Partnership Project; Technical Specification Group Radio Access Network; Multiplexing and Channel Coding (FDD), Release 1999" 3G TS 25.212, V3.2.0, pp. 1-11, 20-23, 38-42, Mar. 2000.

* cited by examiner

*Primary Examiner*—Stephen M. Baker
(74) *Attorney, Agent, or Firm*—Oblon, Spivak, McClelland, Maier & Neustadt, P.C.

(57) ABSTRACT

A method and device for de-interleaving and rate de-matching of a demodulated signal by batch processing at a receiving side, which receives a radio signal subjected to interleaving and rate matching at the transmitting side for error correction.

13 Claims, 7 Drawing Sheets

ERROR-CORRECTING COMMUNICATION METHOD AND COMMUNICATION APPARATUS WITH DE-INTERLEAVING AND RATE DE-MATCHING

BACKGROUND OF THE INVENTION

1. Field of the Invention

The present invention relates to an error-correcting communication method and a communication device using the communication method.

2. Background Art

FIG. 1 is a block diagram showing a part of the configuration of a conventional base station of the CDMA (Code Division Multiple Access) system. In FIG. 1, reference numeral 1 denotes a receiving antenna, 2 a radio unit, 3 a digital signal processing unit, 4 a network, 5 a demodulating unit in the digital signal processing unit 3, and 6 an error correcting unit in the digital signal processing unit 3.

Next, the operation of the prior art example will be described below.

The receiving antenna 1 receives a radio signal from a mobile communication terminal (not shown), and supplies it to the radio unit 2. The radio unit 2 correlates the radio signal with an independent spreading code in each communication channel (i.e., de-spreads the radio signal) to extract a primary modulated signal, which is applied to the digital signal processing unit 3. The demodulating unit 5 of the digital signal processing unit 3 demodulated the primary modulated signal, and provides the demodulated signal to the error correcting unit 6. The error correcting unit 6 corrects an error caused in the transmission line.

To make the error correction, the transmitting side sends out information after imparting redundancy to the information under certain rules and subjecting it to various kinds of coding. For example, according to the 3GPP (3rd Generation Partnership Project) specifications, in an up-link from the mobile communication terminal to the base station, voice data of main information and control data for control use are each added with CRC (Cyclic Redundancy Check) data for each frame, and they are subjected to turbo coding and convolution coding. This is followed by first interleaving that makes a frame by frame data replacement. And, rate matching such as repeat process and puncture process is performed for frame adjustment that ensures the bit rate over the entire length of the up-link. Moreover, second interleaving is performed to make an intra-frame bit replacement.

Accordingly, the receiving side is required to perform in the error correcting unit 6 in FIG. 1 error correction process that is inverse to the process performed at the transmitting side. FIG. 2 depicts a part of the error correction process that is conducted in the error correcting unit 6. That is, the demodulated signal provided from the demodulating unit 6 is subjected to second de-interleaving (step ST1), which is followed by rate de-matching (step ST2), then first de-interleaving (step ST3), and turbo decoding and convolution decoding (step ST4), then it is output.

FIG. 3 is a circuit diagram showing a part of the conventional error correcting unit. Reference numeral 11 denotes a second de-interleaving circuit, and 12 a rate de-matching circuit. In the second de-interleaving circuit 11, reference numeral 13 denotes an input DP (Dual Port) RAM, 14 an address counter circuit for second de-interleave use, and 15 an output DPRAM. In the rate de-matching circuit 12, reference numeral 16 denotes an input DP RAM, 17 a rate de-matching operation circuit, and 18 an output DPRAM. Further, though it is not shown in the drawing, there is connected to the output side of the rate de-matching circuit 12 a first de-interleaving circuit that has about the same configuration as that of the second de-interleaving circuit 11 and comprises an input DPRAM, an output DPRAM and an address counter circuit for first de-interleave use.

Next, the operation of conventional error correcting unit will be described below.

Demodulated signal data of a several frames, for instance, two frames, is written in the input DPRAM 13, from which the data is read out in the form in which it is rearranged or de-interleaved according to address data provided from the address counter circuit 14, and thus the read-out data is written in the output DPRAM 15. The de-interleaved data read out from the output DPRAM 15 is written in the input DPRAM 16.

Next, the data read out from the input DPRAM 16 is fed to the rate de-matching circuit 17, wherein it is subjected to rate de-matching. That is, the data is subjected to process inverse to the repeat or puncture process. And the data is written in the output DPRAM 18. Further, the data read out therefrom is subjected to first de-interleaving in the first de-interleaving circuit which is not shown in the drawing.

With the conventional communication scheme that performs the de-interleaving and rate de-matching and the communication device using the communication scheme, however, much time is required for writing and reading of data from and to DPRAM in the de-interleaving and rate de-matching, this gives rise to a problem of extended processing time throughout the communication system. Moreover, the use of a large number of memories in the device inevitably raises a cost of the device and constitutes an obstacle to its miniaturization.

The present invention is intended to solve the above mentioned problems, and it has an object to provide a communication method that permits reduction of the processing time of the communication system.

Another object of the present invention is to provide a communication device that permits reduction of an amount of memories used, to cut down the cost of the device and to do its miniaturization.

SUMMARY OF THE INVENTION

A communication method according to an aspect of the present invention is adapted to perform de-interleaving and rate de-matching of a demodulated signal by a batch process at the receiving side having received a radio signal subjected to interleaving and rate matching at the transmitting side for error correction.

This permits reduction of the overall processing time of the communication system.

In the communication method according to the present invention, the de-interleaving is second de-interleaving that rearranges frame data of the demodulated signal on a bit by bit basis in each frame.

This permits reduction of the overall processing time of the communication system.

In the communication method according to the present invention, the second de-interleaving is to rearrange the frame data of the demodulated signal of a radio signal sent from a mobile communication terminal on a bit by bit basis in each frame.

This permits reduction of the processing time in a base station system.

In the communication method according to the present invention, the de-interleaving is first de-interleaving that rearranges frame data of the demodulated signal on a frame by frame basis.

This permits reduction of the overall processing time of the communication system.

In the communication method according to the present invention, the second de-interleaving is to rearrange frame data of a demodulated signal of a radio signal sent from a base station on a bit by bit basis in each frame.

This permits reduction of the processing time in a mobile communication terminal system.

In the communication method according to the present invention, the first de-interleaving is to rearrange the frame data of the demodulated signal of a radio signal sent from a mobile communication terminal on a frame by frame basis.

This permits reduction of the processing time in a base station system.

In the communication method according to the present invention, the rate de-matching is performed by independent operations on voice data and control data of the demodulated signal.

This permits reduction of the overall processing time of the communication system.

In the communication method according to the present invention, the de-interleaving is composed of second de-interleaving for bit by bit rearrangement of frame data of the demodulated signal and first de-interleaving for frame by frame rearrangement of frame data of the demodulated signal.

This permits reduction of the overall processing time of the communication system.

In the communication method according to the present invention, the de-interleaving is performed together with bit-number conversion in the same process.

This permits reduction of the overall processing time of the communication system.

A communication device according to one aspect of the present invention is the device for a receiving side that receives a radio signal subjected to interleaving and rate matching at a transmitting side for error correction, the communication device including: first storage means for storing data of a demodulated signal; memory control means for reading out data stored in the first storage means while de-interleaving the data; operation means for rate de-matching the data read out by the memory control means; and second storage means for storing the data subjected to rate de-matching by the operation means.

This permits cost reduction and miniaturization of the communication device. This also allows reduction of the processing time of the communication device.

In the communication device according to the present invention, the operation means includes voice data operation means for performing rate de-matching of voice data and control data operation means for performing rate de-matching of control data.

This permits reduction of the processing time of the communication device.

In the communication device according to the present invention, the first storage means and the second storage means each possess a bit conversion function for converting the number of bits between the data to be written therein and the data to be read out therefrom.

This permits reduction of the processing time of the communication device.

In the communication device according to the present invention, the memory control means reads out the stored data from the first storage means while performing second de-interleaving that rearranges frame data on a bit by bit basis for each frame.

This permits cost reduction and miniaturization of the communication device. This also allows reduction of the processing time of the communication device.

In the communication device according to the present invention, the memory control means rearranges frame data of a demodulated signal of a radio signal sent from a base station on a bit by bit basis in each frame.

This permits cost reduction and miniaturization of a mobile communication terminal. This also permits reduction of the processing time of the mobile communication terminal.

A communication device according to another aspect of the present invention is the device for a receiving side that receives a radio signal subjected to interleaving and rate matching at a transmitting side for error correction, the communication device including: first storage means for storing data of a demodulated signal; operation means for performing rate de-matching of data read out from the first storage means; memory control means for reading out frame data subjected to rate de-matching by the operation means while performing first de-interleaving that rearranges the data on a frame by frame basis; and second storage means for storing the data read out by the memory control means while being subjected to first de-interleaving.

This permits cost reduction and miniaturization of the communication device. This also allows reduction of the processing time of the communication device.

The communication device according to the present invention further includes another memory control means for reading out the data stored in the first storage means while performing second de-interleaving that rearranges frame data on a bit by bit basis in each frame.

This permits cost reduction and miniaturization of the communication device. This also allows reduction of the processing time of the communication device.

In the communication device according to the present invention, the another memory control means rearranges frame data of a demodulated signal of a radio signal sent from a mobile communication terminal on a bit by bit basis for each frame.

This permits cost reduction and miniaturization of the communication device in the base station. This also allows reduction of the processing time of the base station.

DESCRIPTION OF THE PREFERRED EMBODIMENTS

To facilitate a better understanding of the present invention, a description will be given, with reference to the accompanying drawings, of the best mode for carrying out the invention.

Embodiment 1

Figure 1:
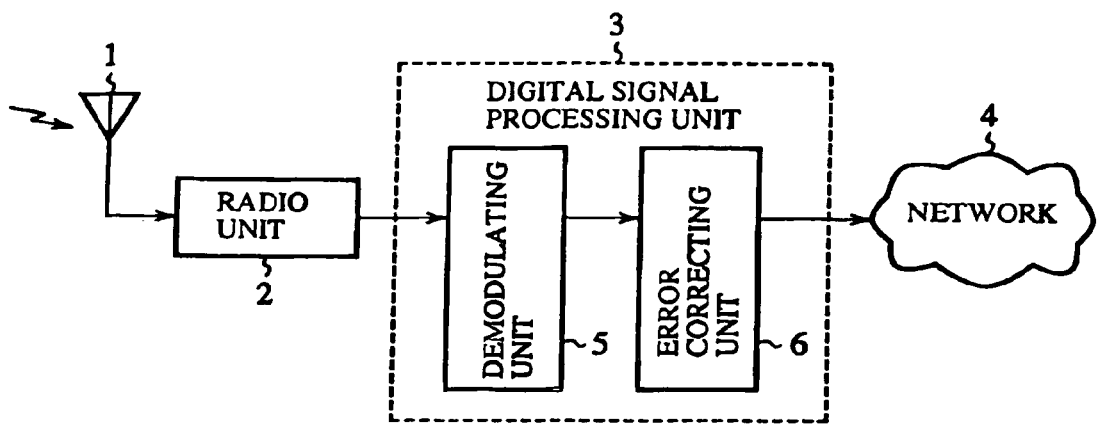
FIG. 1 is a block diagram depicting a part of the configuration of a conventional base station of the CDMA system.
Figure 2:
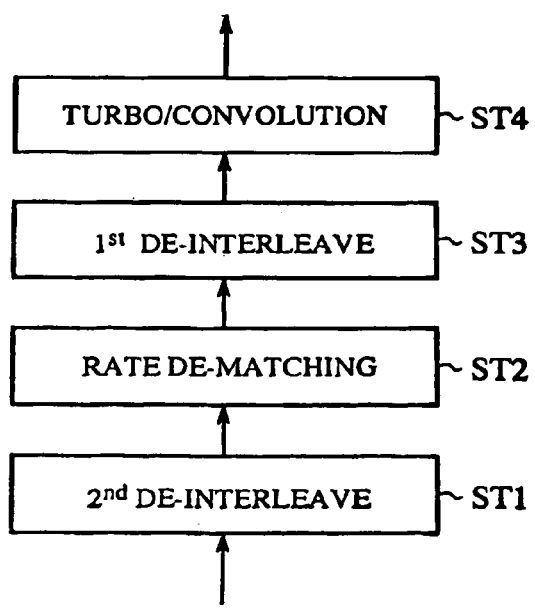
FIG. 2 is a flowchart showing processing by a conventional error correcting unit in FIG. 1.
Figure 3:
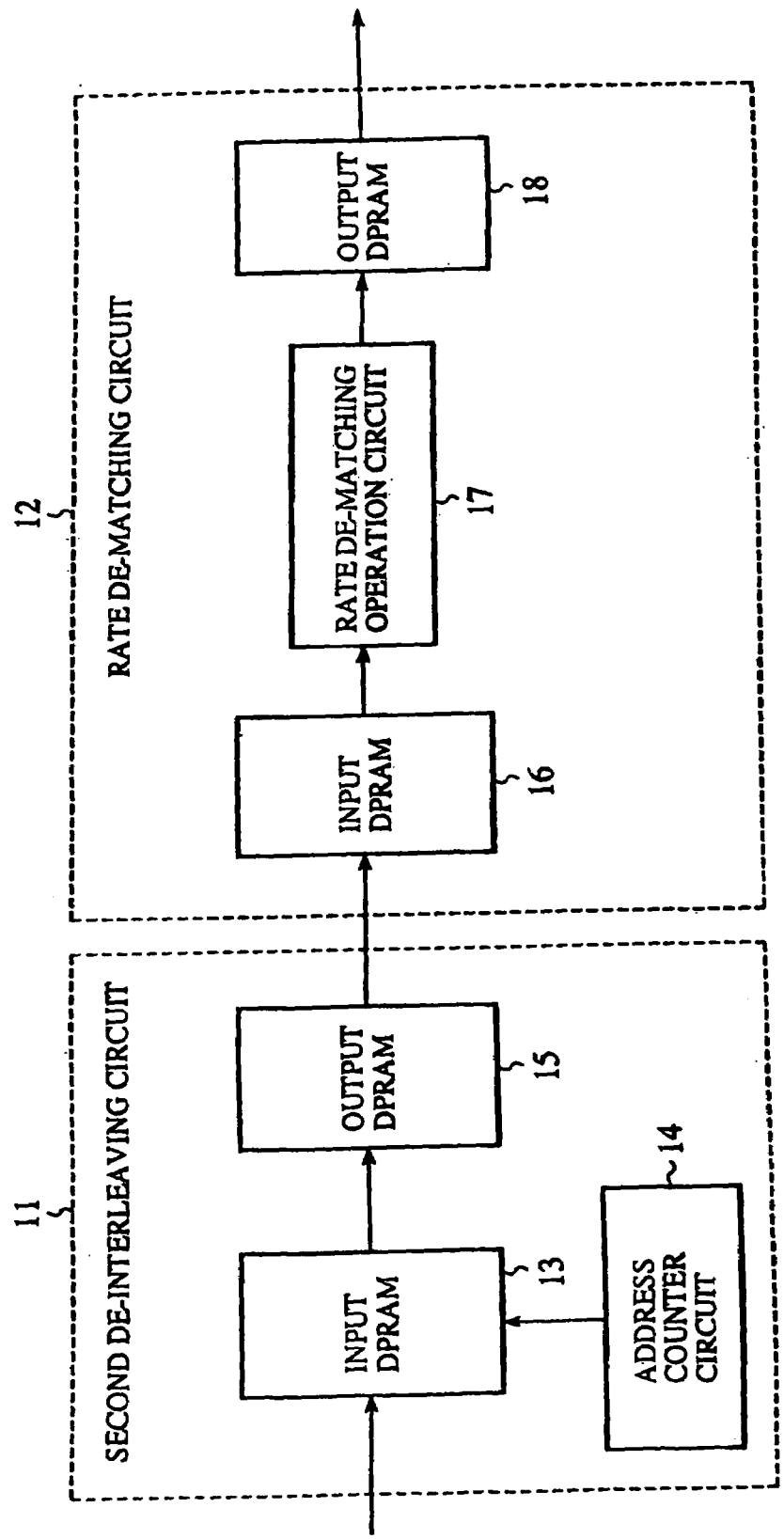
FIG. 3 is a block diagram showing the configuration of a part of the conventional error correcting unit in FIG. 1.
Figure 4:
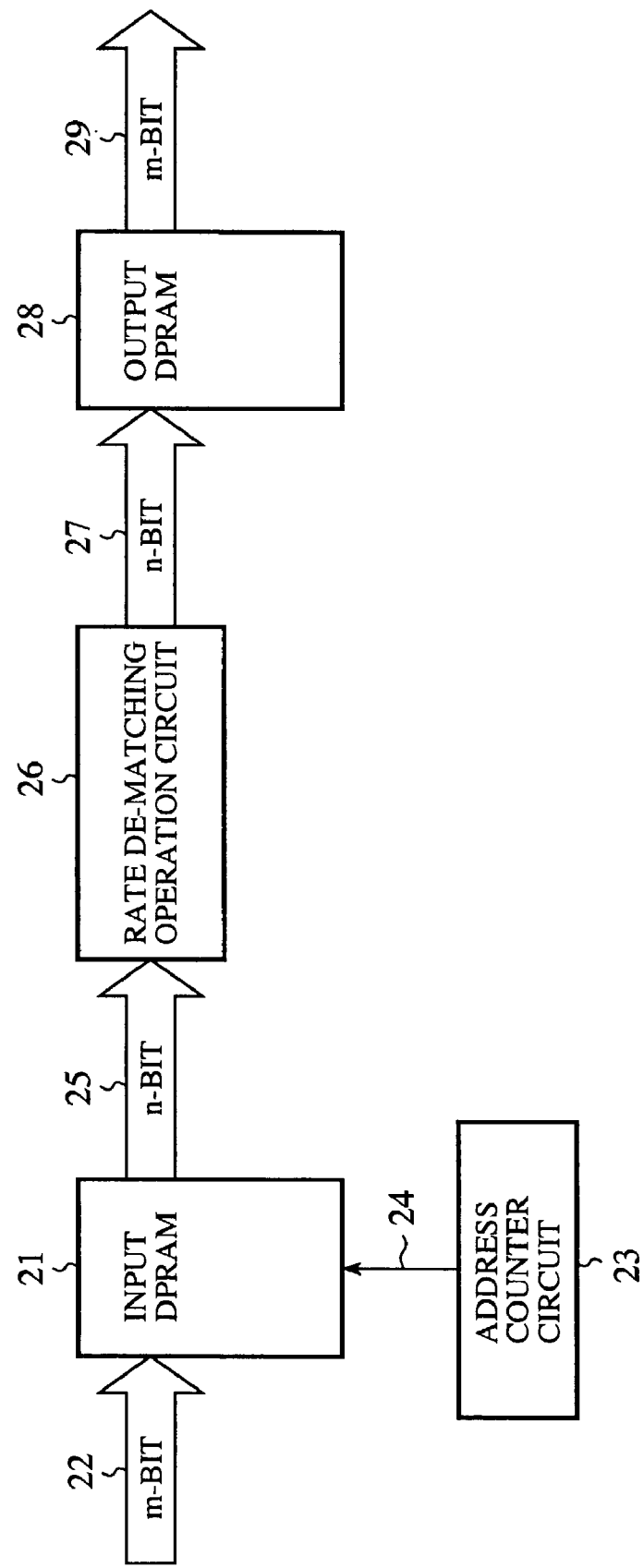
FIG. 4 is a block diagram illustrating a part of communication device of a base station in the CDMA system according to Embodiment 1 of the present invention.

FIG. 4 illustrates in block form a part of communication device of a base station in the CDMA system according to Embodiment 1 of the present invention. In FIG. 4, reference numeral 21 denotes an input DP (Dual Port) RAM (first storage means); 22 denotes m-bit demodulated signal data; 23 denotes an address counter circuit (memory control means); 24 denotes address data that is output from the address counter circuit (hereinafter referred to as a "counter circuit") 23; 25 denotes n-bit data that is output from the input DPRAM 21; 26 denotes a rate de-matching operation circuit (operation means); 27 denotes n-bit data that is output from the rate de-matching operation circuit (hereinafter referred to as a "operation circuit") 26; 28 denotes an outputDPRAM (second storage means); and 29 denotes m-bit data that is output from the output DPRAM 28.

Next, the operation of this embodiment will be described below.

The demodulated signal data 22 is data demodulated from what is called an up-link radio signal transmitted from a mobile communication terminal which is not shown in the drawing; for example, 40 bits form one slot and 15 slots constitute one frame. Accordingly, one frame consists of 600 bits, 490 bits of which are voice data and the remaining 110 bits are control data. Incidentally, the data 22 is the one added with CRC data for error correction and subjected to interleaving and rate matching in the mobile terminal equipment.

The input DPRAM 21 stores the demodulated signal data 22 in accordance with address data from a memory control circuit which is not shown in the drawing. The data input port is m-bit, and the input DPRAM stores data of several frames, for instance, two frames. And the data output port is n-bit. Accordingly, the input DDPRAM 21 has a function of converting m-bit data to n-bit form. It has a parallel-serial conversion capability of converting, for example, 16-bit data to 1-bit form.

The counter circuit 23 provides the address data 24 to the input DPRAM 21 to read out the data stored therein. In this instance, the counter circuit reads out the interleaved data while de-interleaving it for restoration to its original form. The de-interleaving in this case is second de-interleaving that rearranges the frame data on a bit by bit basis in the frame.

The n-bit data 25 read out from the input DPRAM 21 is fed to the operation circuit 26. The operation circuit 26 performs rate de-matching for restoring the rate-matched data to the original form. That is, the operation circuit deletes bits added by a repeat process and replenishes bits eliminated by a puncture process. The n-bit data 27 thus subjected to rate de-matching and output is stored in the output DPRAM 28. The output DPRAM 28 has an n-bit data input port and an m-bit data output port.

In other words, the output DPRAM 28 has a function of converting n-bit data to m-bit form. It has a serial-parallel conversion capability of converting, for example, 1-bit data to 16-bit form. The m-bit data 29 from the output DPRAM 28 is fed to the next processing circuit, for instance, to circuits that perform, for example, first de-interleaving, turbo decoding, and convolution decoding.

As it is evident from the above description, according to Embodiment 1, at the receiving side which receives the radio signal subjected to interleaving and rate matching at the transmitting side for error correction, de-interleaving and rate de-matching of the demodulated signal are performed by a batch process; hence, this embodiment permits reduction of the overall processing time of the communication system. Further, since the number of RAMS used is smaller than that in the conventional configuration, cost reduction and miniaturization of the communication device can be achieved.

In this instance, since the demodulated signal of the radio signal sent from the mobile communication terminal is subjected to second de-interleaving and rate de-matching by the batch process, the processing time of the base station system can also be reduced. Moreover, since the number of RAMs used is smaller than that in the conventional base station, cost reduction and miniaturization of the communication device of the base station can be achieved.

Besides, in this case, since the input DPRAM 21 and the output DPRAM 28 both have the bit conversion capability of converting the number of bits between the data written therein and the data read out therefrom, the processing time of the communication device can be reduced.

Embodiment 2

Figure 5:
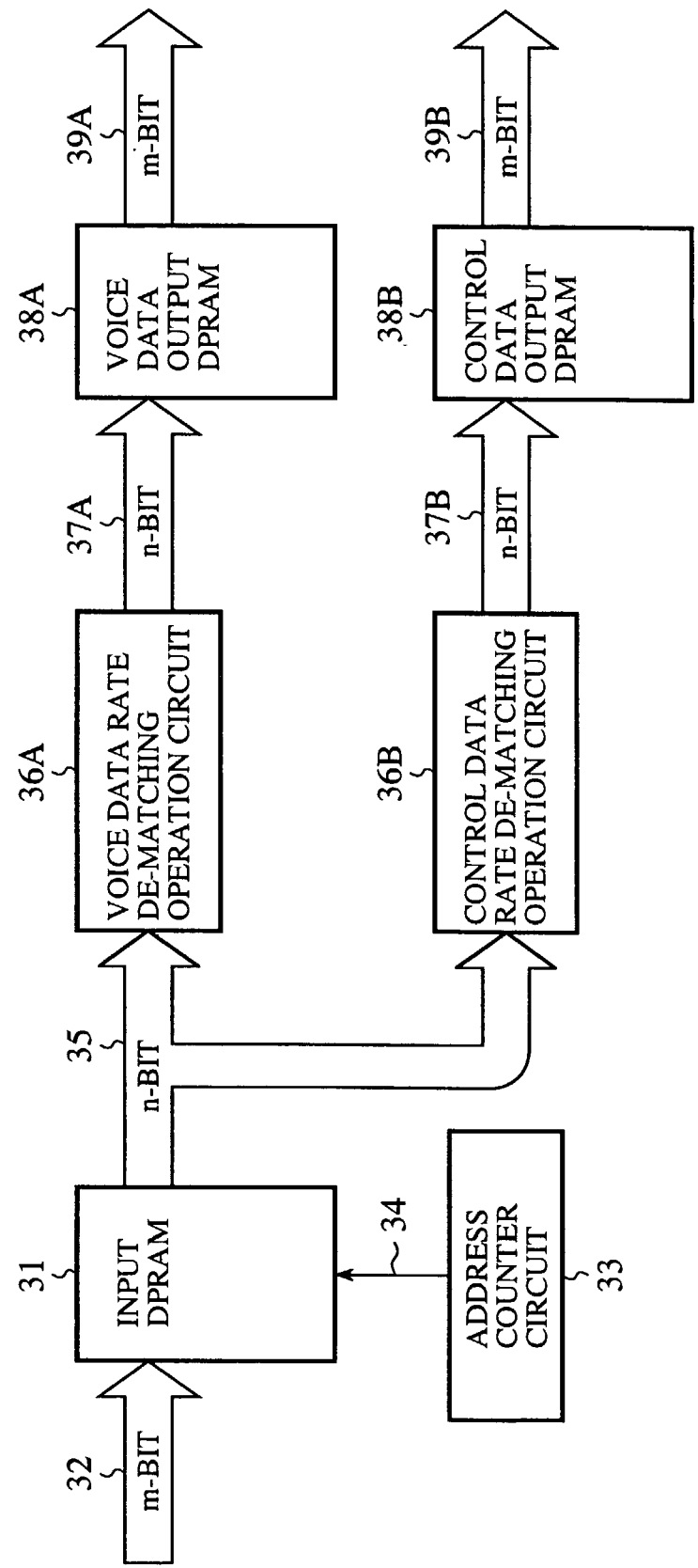
FIG. 5 is a block diagram illustrating a part of communication device of a base station in the CDMA system according to Embodiment 2 of the present invention.

FIG. 5 is a block diagram illustrating a part of communication device of a base station in the CDMA system according to Embodiment 2 of the present invention. In FIG. 5, reference numeral 31 denotes an input DPRAM (first storage means); 32 denotes m-bit demodulated signal data; 33 denotes an address counter circuit (memory control means); 34 denotes address data that is provided from the address counter circuit (hereinafter referred to as a "counter circuit"); 35 denotes n-bit data that is output from the input DPRAM 35; 36A denotes a voice data rate de-matching operation circuit (operation means: voice data operation means); 36B denotes a control data rate de-matching operation circuit (operation means: control data operation means); 37A and 37B denote n-bit voice data and control data that are provided from the voice data rate de-matching operation circuit (hereinafter referred to as a "voice data operation circuit") 36A and the control data rate de-matching operation circuit (hereinafter referred to as a "control data operation circuit") 36 B, respectively; 38A and 38B denote a voice data output DPRAM (second storage means) and control data output DPRAM (second storage means), respectively; and 39A and 39B denote m-bit voice data and control data that are output from the voice data output DPRAM 39A and the control data DPRAM 39B, respectively.

Incidentally, in this instance, the voice data output DPRAM 39A and the control data output DPRAM 39B need not necessarily be provided separately but may also be formed by a single dual port RAM.

Next, the operation of this embodiment will be described below.

The operation until the demodulated signal data 32 is stored in the input DPRAM 31 is the same as the operation until the demodulated signal data is stored in the input DPRAM in Embodiment 1. Further, this embodiment is common to Embodiment 1 in that the input DPRAM 31 is capable of converting m-bit data to n-bit form and that the voice data output DPRAM 39A and the control data output DPRAM 39B are both capable of converting n-bit data to m-bit form.

The data stored in the input DPRAM 31 is read out by the address data from the counter circuit 33 while being subjected to second de-interleaving. That is, frame data is rearranged bit by bit in the frame. In thus the read out data 35, the voice data is fed to the voice data operation circuit 36A and the control data is fed to the control data operation circuit 36B. And, the voice data and the control data are both subjected to rate de-matching.

After this, the data output from the voice data operation circuit 36A and the control data from the control data operation circuit 36B, that is, the rate-de-matched voice data 37A and control data 37B are stored in the voice data output DPRAM 39A and the control data output DPRAM 39B, respectively. And, the m-bit voice data and control data that are output from the respective DPRAMs and applied to processing circuits at the stages following them.

As it is evident from the above description, according to Embodiment 2, the voice data and the control data forming the demodulated signal are subjected to rate de-matching by independent operation circuits, the overall processing time of the communication system can be reduced. Besides, the provision of two data output ports in the input DPRAM for the voice data and for the control data permits simultaneous initiation of the rate de-matching of the voice data and the control data.

Embodiment 3

Figure 6:
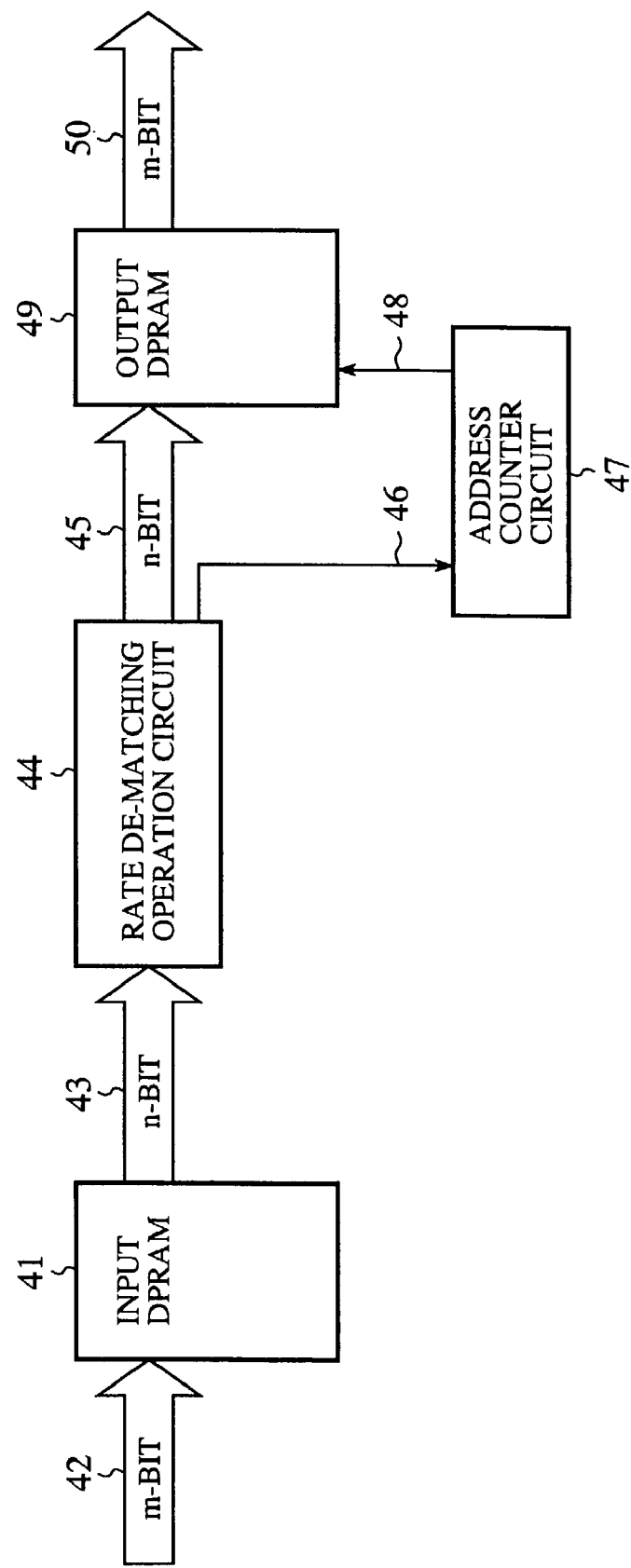
FIG. 6 is a block diagram illustrating a part of communication device of a base station in the CDMA system according to Embodiment 3 of the present invention.

FIG. 6 is a block diagram illustrating a part of communication device of the base station in the CDMA system according to the present invention. In FIG. 6, reference numeral 41 denotes an input DPRAM (first storage means); 42 denotes m-bit demodulated signal data; 43 denotes n-bit data that is output from the input DPRAM 23; 44 denotes rate de-matching operation circuit (operation means); 45 denotes n-bit data that is output from the rate de-matching operation circuit (hereinafter referred to as an "operation circuit") 44; 46 denotes address data that is provided from the operation circuit 44; 47 denotes an address counter circuit (memory control means); 48 denotes address data that is output from the address counter circuit (hereinafter referred to as a "counter circuit") 47; 49 denotes an output-DPRAM (second storage means); and 50 denotes m-bit data that is output from the output DPRAM 49.

Next, the operation of this embodiment will be described below.

The m-bit data 42 is written and stored in the input DPRAM 41 via its data input port, then the data is read out therefrom as the bit converted n-bit data 43 via its data output port and fed to the operation circuit 44. The operation circuit 44 performs rate de-matching of the data 43. Thus the rate de-matched data 45 is output together with the address data 46. And, the data 45 is fed to the data input port of the output DPRAM 49, whereas the address data 46 is provided to the counter circuit 47.

The counter circuit 47 generates the address data 48 based on the address data 46, and provides it to the output DPRAM 49. In this instance, the address data 48 that is fed to the output DPRAM 49 is those data 45 is rearranged on a frame by frame basis. That is, the counter circuit writes the address data in the output DPRAM 49 while first de-interleaving the data 45. And, the m-bit data 50 converted from the n-bit data is read out from the output DPRAM 49 via its output port for supply to the subsequent process.

As it is evident from the above description, according to Embodiment 3, the first de-interleaving and rate de-matching of the demodulated signal are performed by the batch process at the receiving side which receives the radio signal subjected to interleaving and rate matching at the transmitting side for error correction, and hence this embodiment permits reduction of the overall processing time of the communication system.

In this case, the first de-interleaving by the counter circuit 47 is adapted so that the data frame forming the demodulated signal is rearranged for each frame, the number of RAMs used can be reduced as compared with that needed in the prior art, this permits cost reduction and miniaturization of the communication device.

Besides, in this instance, since the first de-interleaving is performed by frame-by-frame rearrangement of the frame data forming the demodulated signal demodulated from the radio signal sent from the mobile communication terminal, the processing time of the base station system can be reduced.

Embodiment 4

Figure 7:
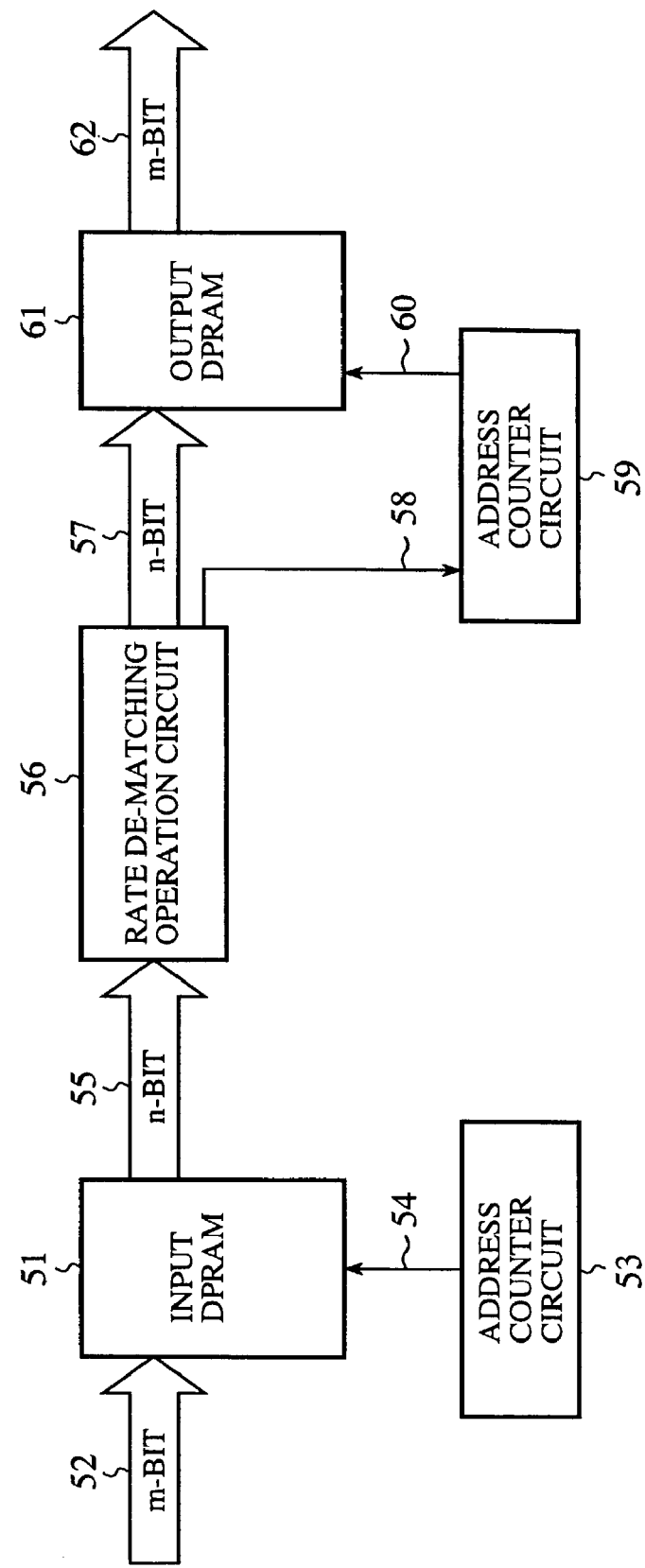
FIG. 7 is a block diagram illustrating a part of communication device of a base station in the CDMA system according to Embodiment 4 of the present invention.

FIG. 7 is a block diagram illustrating a part of communication device of a base station in the CDMA system according to Embodiment 4 of the present invention. In FIG. 7, reference numeral 51 denotes an input DPRAM (first storage means); 52 denotes m-bit demodulated signal data; 53 denotes an address counter circuit (memory control means different from the memory control means mentioned later on); 54 denotes address data that is output from the address counter circuit (hereinafter referred to as a "counter circuit") 53; 55 denotes n-bit data that is output from the input DPRAM 51; 56 denotes a rate de-matching operation circuit (operation means); 57 denotes n-bit data that is output from the rate de-matching operation circuit (hereinafter referred to an "operation circuit") 56; 58 denotes address data that is output from the operation circuit 56; 59 denotes an address counter circuit (memory control means); 60 denotes address data that is output from the address counter circuit (hereinafter referred to as a "counter circuit") 59; 61 denotes an output DPRAM (second storage means); and 62 denotes m-bit data that is output from the output DPRAM 61.

Next, the operation of this embodiment will be described below.

The input DPRAM 51 stores, according to predetermined address data, the demodulated signal data 52 demodulated from a radio signal transmitted from a mobile communication terminal which is not shown in the drawing. As is the case with Embodiment 1, the input DPRAM 51 possesses the function of converting m-bit data to n-bit form.

The counter circuit 53 provides the address data 54 to the input DPRAM 51 to read out therefrom the stored data. In this instance, the data is read out while being de-interleaved. The de-interleaving in this case is second de-interleaving that rearranges frame data for each bit in the frame.

The n-bit data 55 read out from the input DPRAM 51 is fed to the operation circuit 56. The operation circuit 56 performs rate de-matching. The rate de-matched n-bit data 57 is output together with the address data 58. The data 57 is provided to a data input port of the output DPRAM 61, whereas the address data 58 is fed to the counter circuit 59.

The counter circuit 59 generates, based on the address data 58, the address data 60 and provides it to the output DPRAM 61. In this instance, the counter circuit generates the address data 60 such that the data 57 is rearranged on a frame by frame basis. That is, the data 55 is written in the output DPRAM 61 while being subjected to first de-interleaving. And, the m-bit data 62 converted from n-bit form is read out from a data output port of the output DPRAM for supply to subsequent process.

As it is evident from the above description, according to Embodiment 4, the second de-interleaving, rate de-matching and first de-interleaving of the demodulated signal are performed by the batch process at the receiving side which receives the radio signal subjected to interleaving and rate matching at the transmitting side for error correction, and hence this embodiment permits reduction of the overall processing time of the communication system. Further, the batch process permits reduction of the number of RAMs used, allowing cost reduction and miniaturization of the communication device.

In this case, since the second de-interleaving and the first de-interleaving by the counter circuits are performed simultaneously with the conversion of the bit number of data, the overall processing time of the communication system can be reduced.

Embodiment 5

Figure 8:
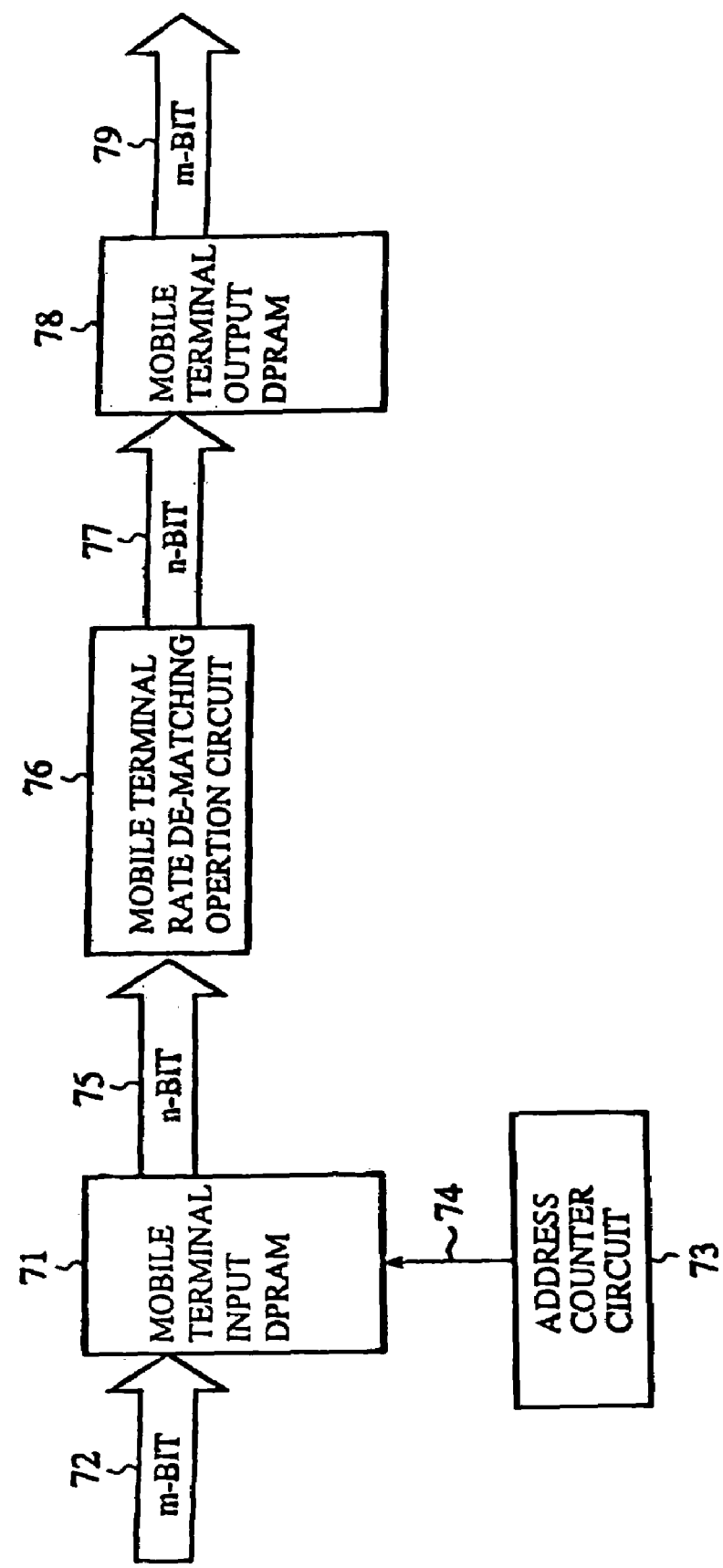
FIG. 8 is a block diagram illustrating a part of mobile communication terminal in the CDMA system according to Embodiment 5 of the present invention.

FIG. 8 is a block diagram showing a part of mobile communication terminal in the CDMA system according to Embodiment 5 of the present invention. In FIG. 8, reference numeral 71 denotes a mobile terminal input DPRAM (first storage means); 72 denotes an n-bit demodulated signal data; 73 denotes an address counter circuit (memory control means); 74 denotes address data that is output from the address counter circuit (hereinafter referred to as a "counter circuit") 73; 75 denotes n-bit data that is output from the input DPRAM 71; 76 denotes a mobile terminal rate de-matching operation circuit (operation means); 77 denotes n-bit data that is output from the mobile terminal rate de-matching operation circuit (hereinafter referred to as an "operation circuit") 76; 78 denotes a mobile terminal output DPRAM (second storage means); and 79 denotes m-bit data that is output from the output DPRAM 78.

Next, the operation of this embodiment will be described below.

The input DPRAM 71 stores, according to predetermined address data, the demodulated signal data 72 demodulated from a radio signal transmitted from a base station which is not shown in the drawing. The input DPRAM 71 possesses the function of converting m-bit data to n-bit form. The counter circuit 73 provides the address data 74 to the input DPRAM 71 to read out therefrom the stored data. In this case, the counter circuit reads out the data while de-interleaving it. The de-interleaving in this case is second de-interleaving that rearranges frame data on a bit by bit basis in the frame.

The n-bit data 75 output from the input DPRAM 71 is fed to the operation circuit 76. The operation circuit 76 performs rate de-matching. The n-bit data 77 output after rate de-matching is provided to a data input port of the output DPRAM 78. And, the data 79 that is output from a data output port of the output DPRAM 78 is supplied for subsequent process.

As it is evident from the above description, according to Embodiment 5, the second de-interleaving and rate de-matching of the demodulated signal transmitted from a radio signal sent from a base station are performed by the batch process and hence this embodiment permits reduction of the processing time at the mobile communication terminal. Further, the batch process permits reduction of the number of RAMs used, allowing cost reduction and miniaturization of the mobile communication terminal.

Besides, since the frame data that forms the demodulated signal demodulated from the radio signal sent from the base station is rearranged for each frame, the processing time at the mobile communication terminal can be reduced.

INDUSTRIAL APPLICABILITY

As described above, since the de-interleaving and rate de-matching of the demodulated signal are performed by the batch process at the receiving side that receives the radio signal subjected to interleaving and rate matching at the transmitting side for error correction, the communication method and device according to the present invention are suitable for use in a system intended to reduce the overall processing time of the communication system.

What is claimed is:

1. A communication method, comprising:
   receiving at a receiving side for error correction, a radio signal subjected to interleaving and rate matching at a transmitting side;
   demodulating the radio signal to generate a demodulated signal; and
   continuously de-interleaving the demodulated signal by memory control means which reads out data while de-interleaving the data, and rate de-matching the demodulated signal,
   wherein the rate de-matching is performed by independent operations on voice data and control data of the demodulated signal, and the de-interleaving step is performed together with bit-number conversion in the same process.

2. The communication method as claimed in claim 1, wherein said de-interleaving step comprises second de-interleaving for bit by bit rearrangement of frame data of the demodulated signal and first de-interleaving for frame by frame rearrangement of frame data of the demodulated signal.

3. The communication method as claimed in claim 1, wherein said de-interleaving step comprises first de-interleaving that rearranges frame data of the demodulated signal on a frame by frame basis.

4. The communication method as claimed in claim 3, wherein said step of first de-interleaving comprises rearranging frame data of a demodulated signal of a radio signal, sent from a mobile communication terminal, on a frame by frame basis.

5. The communication method as claimed in claim 1, wherein said de-interleaving step comprises second de-interleaving that rearranges frame data of the demodulated signal on a bit by bit basis in each frame.

6. The communication method as claimed in claim 5, wherein said step of second de-interleaving comprises rearranging frame data of a demodulated signal of a radio signal, sent from a mobile communication terminal, on a bit by bit basis in each frame.

7. The communication method as claimed in claim 5, wherein said step of second de-interleaving comprises rearranging frame data of a demodulated signal of a radio signal, sent from a base station, on a bit by bit basis.

8. A communication device for a receiving side configured to receive a radio signal subjected to interleaving and rate matching at a transmitting side, for error correction, said communication device comprising:

first storage means for storing data of a demodulated signal;

memory control means for reading out data stored in said first storage means while de-interleaving the data;

voice data operation means for rate de-matching voice data, and control data operation means for rate de-matching control data, read out by said memory control means; and second storage means for storing the data subjected to rate de-matching by said operation means, wherein said first storage means and said second storage means each comprise bit conversion means for converting a number of bits between data to be written therein and data to be read out therefrom.

9. The communication device as claimed in claim 8, wherein said memory control means reads out the stored data from said first storage means while performing second de-interleaving that rearranges frame data on a bit by bit basis for each frame.

10. The communication device as claimed in claim 9, wherein said memory control means rearranges frame data of a demodulated signal of a radio signal, sent from a base station, on a bit by bit basis for each frame.

11. A communication device for a receiving side that receives a radio signal subjected to interleaving and rate matching at a transmitting side for error correction, said communication device comprising:

first storage means for storing data of a demodulated signal;

operation means for performing rate de-matching of data read out from said first storage means;

memory control means for receiving frame data subjected to rate de-matching from said operation means while performing first de-interleaving that rearranges the received frame data on a frame by frame basis; and second storage means for storing the received frame data read out by said memory control means while being subjected to first de-interleaving.

12. The communication device as claimed in claim 11, further comprising second memory control means for reading out the data stored in the first storage means while performing second de-interleaving that rearranges frame data on a bit by bit basis for each frame.

13. The communication device as claimed in claim 12, wherein said second memory control means rearranges frame data of a demodulated signal of a radio signal sent from a mobile communication terminal, on a bit by bit basis for each frame.

* * * * *